United States Patent [19]

Ikei

[11] Patent Number: 5,367,436
[45] Date of Patent: Nov. 22, 1994

[54] PROBE TERMINATING APPARATUS FOR AN IN-CIRCUIT EMULATOR

[75] Inventor: Satoshi Ikei, Tokyo, Japan
[73] Assignee: NEC Corporation, Japan
[21] Appl. No.: 27,352
[22] Filed: Mar. 8, 1993
[30] Foreign Application Priority Data Mar. 11, 1992 [JP] Japan .................................. 4-052108

[51] Int. Cl.$^5$ ............................................. H05K 1/16
[52] U.S. Cl. .................................... 361/766; 361/760; 361/784; 361/785; 324/754; 324/439
[58] Field of Search ............... 361/736, 760, 766, 784, 361/785, 748; 324/439, 158 R, 158 P; 174/52.4

[56] References Cited

U.S. PATENT DOCUMENTS 5,227,718  7/1993  Stowers et al. .................. 324/158 P
5,233,290  8/1993  Swart ................................ 324/72.5

Primary Examiner—Leo P. Picard
Assistant Examiner—Young Whang
Attorney, Agent, or Firm—Laff, Whitesel, Conte & Saret

[57] ABSTRACT

In a probe terminating apparatus, ground terminals, power supply terminals, and open terminals are provided on a print circuit board, and a ground potential applying terminal and a power supply voltage applying terminal are also provided on the print circuit board. In addition, a pull-down resistance apparatus is inserted to be connected between each of the ground terminals and the ground potential applying terminal, and a pull-up resistance apparatus is inserted to be connected between each of the power supply terminals and the power supply voltage applying terminal. Terminals of an evaluation microcomputer in an in-circuit emulator are connected to the ground terminals, the power supply terminals, and the open terminals by the connection of a probe and an IC socket, or connectors. The probe is connected to the terminals of the evaluation microcomputer, and the IC socket is connected to the ground, power supply and open terminals of the probe terminating apparatus.

3 Claims, 8 Drawing Sheets

PROBE TERMINATING APPARATUS FOR AN IN-CIRCUIT EMULATOR

FIELD OF THE INVENTION

The invention relates to a probe terminating apparatus for an in-circuit emulator, and more particularly to, an apparatus for terminating terminals of an evaluation microcomputer in an in-circuit emulator.

BACKGROUND OF THE INVENTION

A hardware system such as a refrigerator, a car, a watch, etc. is controlled in operation by a microcomputer mounted therein. In order to assist the development of such a hardware system, an in-circuit emulator which comprises an evaluation microcomputer and a memory for a program is used. The evaluation microcomputer evaluates a microcomputer mounted in a hardware system (defined "hardware system to be evaluated in operation" hereinafter). Even prior to the completion of a hardware to be evaluated in operation, therefore, the development and evaluation of a program to be stored in the hardware can be carried out in an in-circuit emulator by using an evaluation microcomputer and a memory included therein. In the development and evaluation of the program, terminals of the evaluation microcomputer must be set to be specifically high and low not to prevent the program form being executed.

For the other reason, most of microcomputers are designed by using CMOS process technology which is characterized in that power consumption is low. Due to the characteristics of CMOS devices, input terminals which are not connected to any terminals must be set to be specifically high and low.

A first conventional method for setting non-connected terminals of an evaluation microcomputer to be high and low is that the non-connected terminals are connected to an IC socket provided in an in-circuit emulator by a probe connected via a cable to the non-connected terminals.

A second conventional method for setting non-connected terminals of an evaluation microcomputer to be high and low is that the non-connected terminals are pulled up to a power supply and down to ground by using pull-up and down resistances.

A third conventional method for setting non-connected terminals of an evaluation microcomputer to be high and low is that the non-connected terminals are connected to a power supply and ground by using selectors.

However, there are disadvantages in the first to third conventional methods in that:

the size is large, the construction is complicated, and the cost is high in the first conventional method, because the IC socket is provided in an in-circuit emulator;

the electric characteristic is changed, and through-current flows through input gates to lower the reliability of a device in the second conventional method, because pull-up resistances connected to a signal line tends to differ in value from each other, and a potential on a signal line divided by resistances happens to turn both p- and n- transistors on; and a number of selectors must be provided, and a signal propagation delay occurs in the third conventional method, because a selector is provided on each signal line.

SUMMARY OF THE INVENTION

Accordingly, it is an object of the invention to provide a probe terminating apparatus for an in-circuit emulator which is small in size, simplified in construction, and low in cost.

It is a further object of the invention to provide a probe terminating apparatus for an in-circuit emulator no through-current flows through input gates, and the electric characteristics are not changed.

It is a still further object of the invention to provide a probe terminating apparatus for an in-circuit emulator in which there is no necessity to have selectors, and no signal propagation delay occurs.

According to the invention, a probe terminating apparatus for an in-circuit emulator, comprising:

ground terminals, power supply terminals, and open terminals provided on a print circuit board;

a ground potential applying terminal and power supply voltage applying terminal provided on the print circuit board;

a pull-down resistance apparatus inserted to be connected between each of the ground terminals and the ground potential applying terminal;

a pull-up resistance apparatus inserted to be connected between each of the power supply terminals and said power supply voltage applying terminal; and means for connecting terminals of an evaluation microcomputer to the ground terminals, the power supply terminals and the open terminals.

BRIEF DESCRIPTION OF THE DRAWINGS

The invention will be explained in more detail in conjunction with appended drawings, wherein.

DESCRIPTION OF THE PREFERRED EMBODIMENTS

Before describing a probe terminating apparatus for an in-circuit emulator of a preferred embodiment according to the invention, conventional probe terminating methods will be explained in FIGS. 1 to 4.

Figure 1:
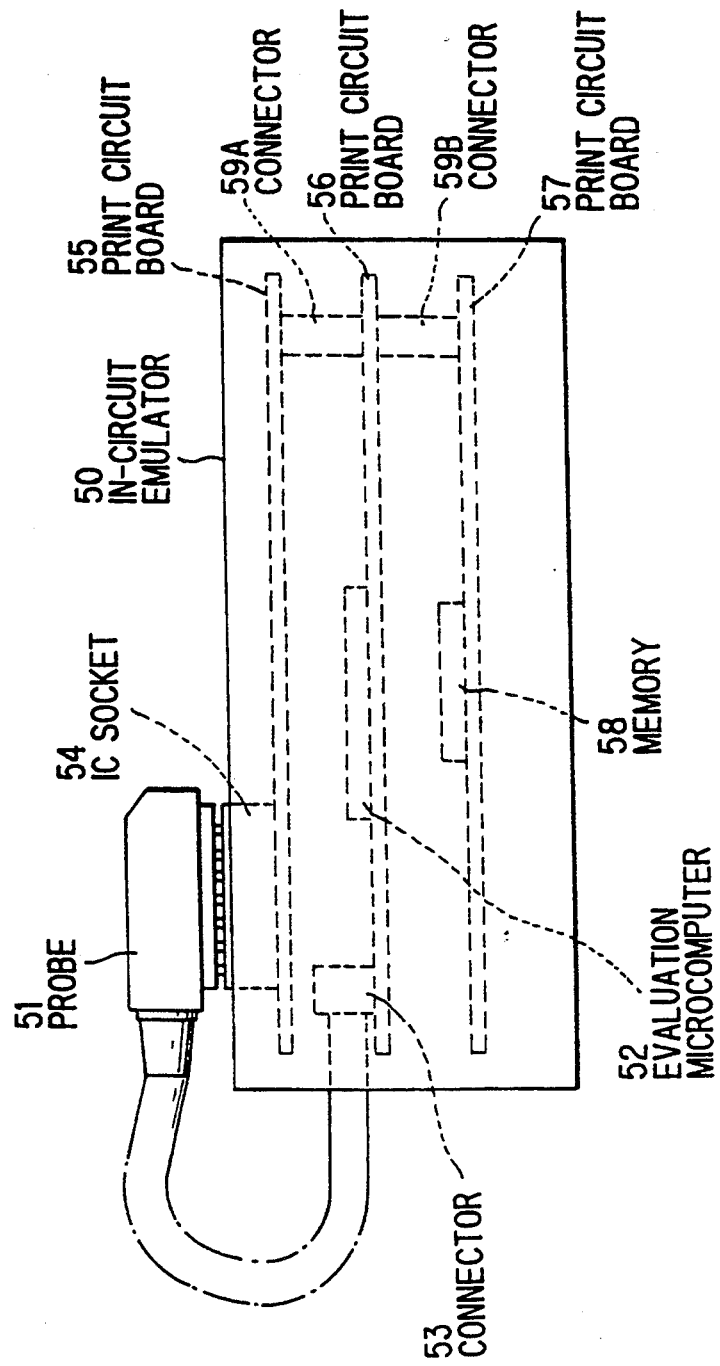
FIG. 1 is an explanatory view showing a first conventional method for setting non-connected terminals of an evaluation microcomputer to be high and low.

FIG. 1 shows a first conventional in-circuit emulator 50 in which a first conventional probe terminating method is carried out. The in-circuit emulator 50 comprises print circuit boards 55 to 57 connected by connector 59A and 59B, wherein an IC socket 54 is provided on the print circuit board 55, an evaluation microcomputer 52 and a connector 53 for connecting a probe 51 to the print circuit board 56 are provided on the print circuit board 56, and a memory 58 for storing a program to be developed is provided on the print circuit board 57.

In operation, the probe 51 is connected to the IC socket 54, so that terminals of the probe 51, that is, terminals of the evaluation microcomputer 52 are set to be specifically high and low. At this state, a program to be developed is stored in the memory 58, from which the program is read to be executed for the development thereof by the evaluation microcomputer 52, and program developing result is displayed on a CRT (not shown) for a programmer. Thus, a developed program is stored in the memory 58.

On the other hand, a hardware system to be evaluated in operation such as a refrigerator, a watch a car, etc. is usually controlled by a microcomputer mounted therein. For the purpose of evaluating operation of the hardware system, the in-circuit emulator 50 is used under a state that the probe 51 is connected to the hardware system. Thus, the program stored in the memory 58 is executed to control the hardware system by the evaluation microcomputer 52 in place of the microcomputer mounted in the hardware system.

Figure 2:
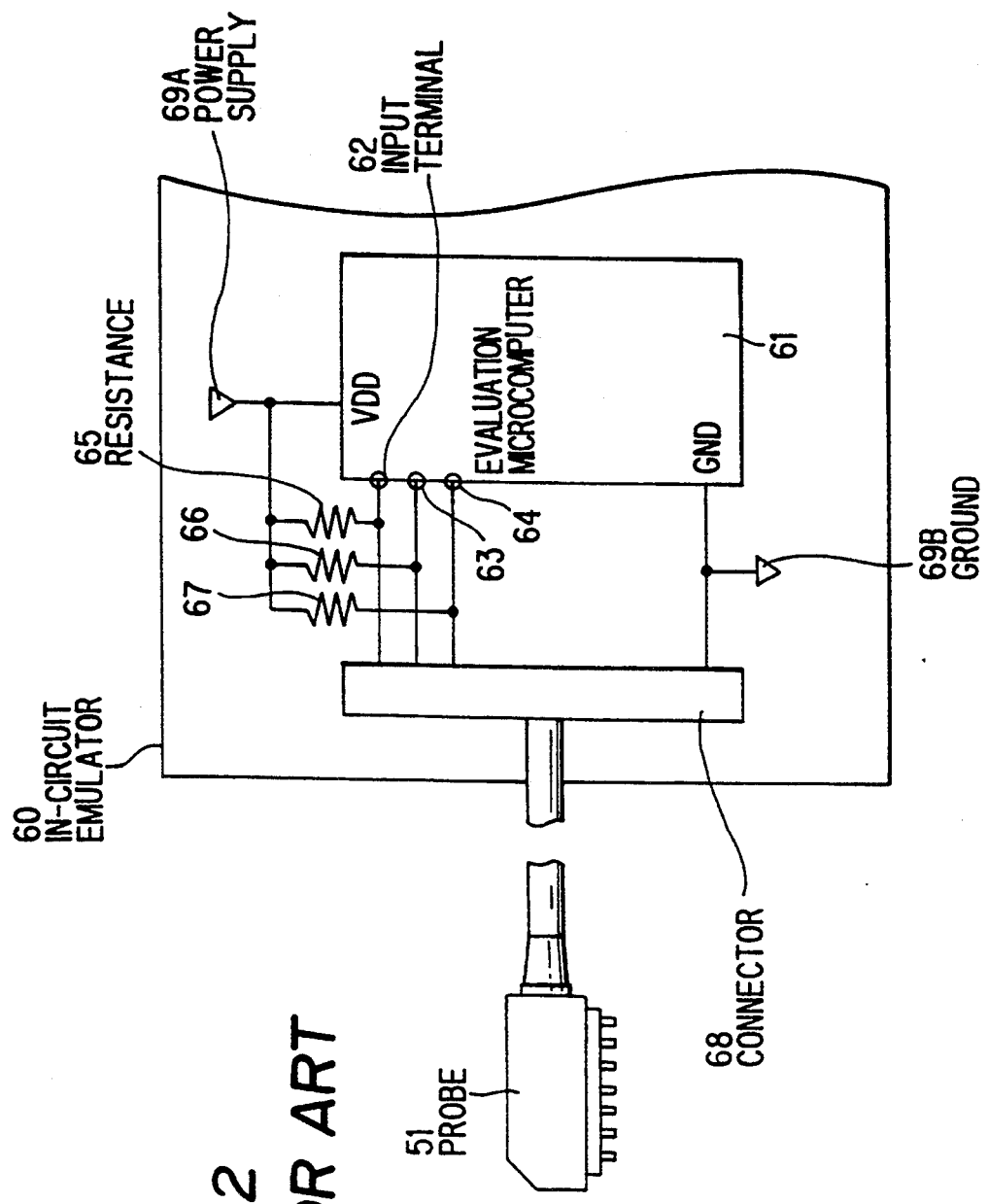
FIG. 2 is an explanatory view showing a second conventional method for setting non-connected terminals of an evaluation microcomputer to be high and low.

FIG. 2 shows a second conventional in-circuit emulator 60 is which a second conventional probe terminating method is carried out. The in-circuit emulator 60 comprises an evaluation microcomputer 61 having power supply terminals VDD and GND connected to a power supply 69A and ground 69B and input terminals 62 to 64, a connector 68 for connecting the evaluation microcomputer 61 via a probe 51 to a hardware system to be controlled by a microcomputer.

In operation, the input terminals 62 to 64 are connected to be pulled up via resistance 65 to 67 to the power supply 69A, so that the input terminals 62 to 64 are set to be high. Thus, a program can be developed, even if the probe 51 is under non-connected state.

Figure 3:
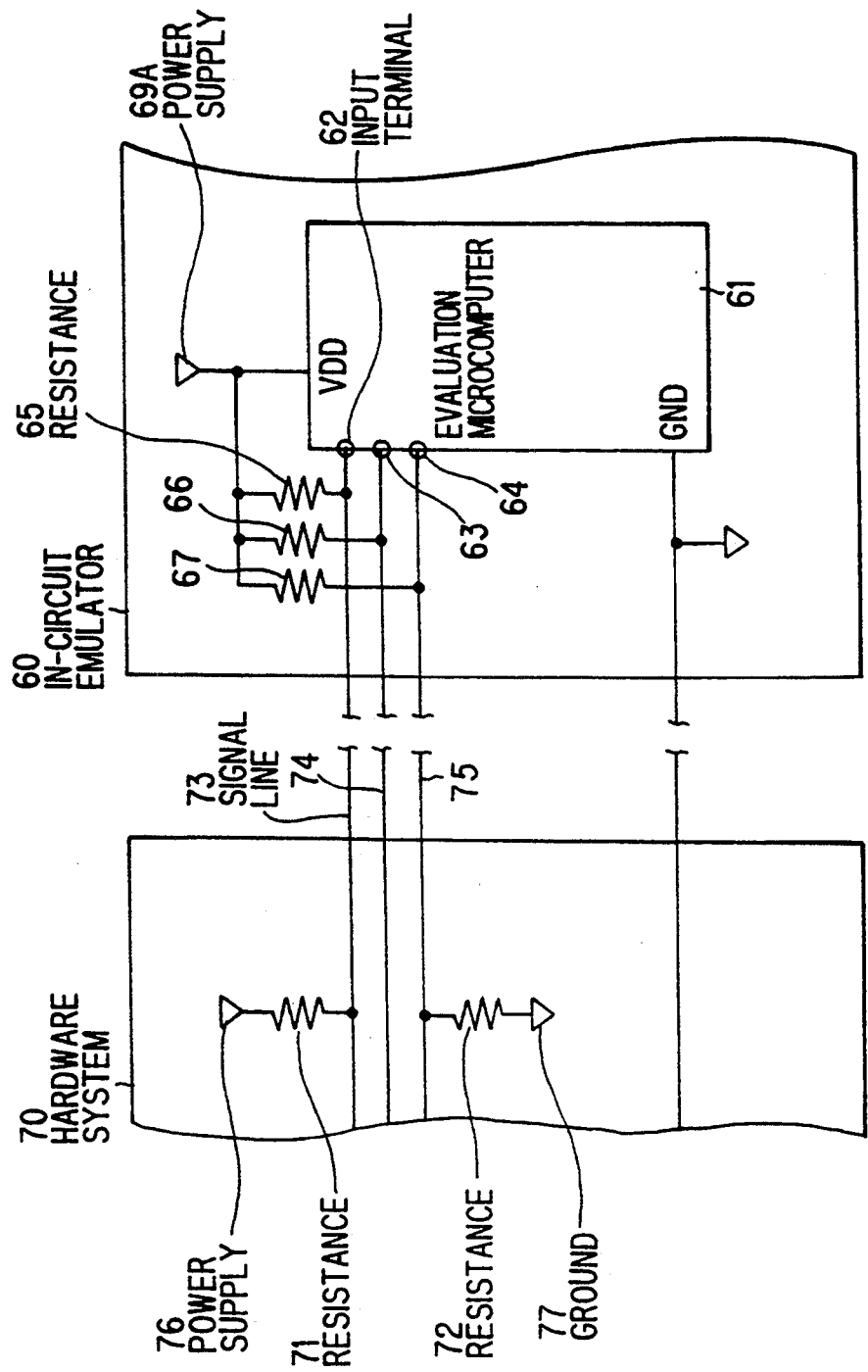
FIG. 3 is an explanatory view showing the connection between a hardware system to be evaluated in operation and an in-circuit emulator in the second conventional method.

FIG. 3 shows a hardware system 70 connected to the in-circuit emulator 60 which is explained in FIG. 2, wherein like parts are indicated by like reference numerals between FIGS. 2 and 3. The hardware system 70 comprises a signal line 73 connected via a resistance 71 to a power supply 76, a signal line 75 connected via a resistance 72 to ground 77, wherein the signal line 73 is pulled up by a sum of the resistances 65 and 71, and the signal line 75 is at a potential divided by the resistances 67 and 72.

Figure 4:
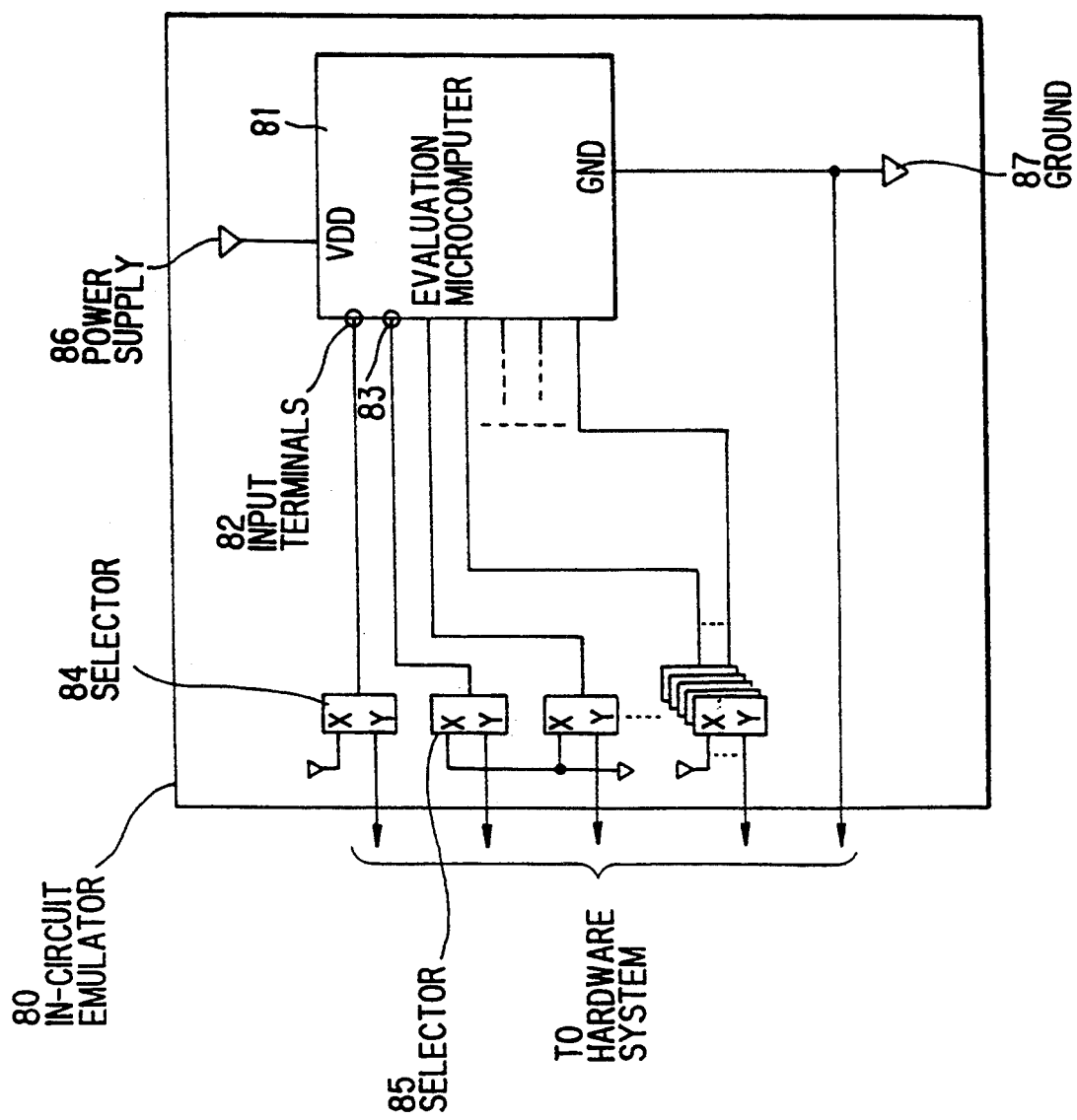
FIG. 4 is an explanatory view showing a third conventional method for setting non-connected terminals of an evaluation microcomputer to be high and low.

FIG. 4 shows a third conventional in-circuit emulator 80 which comprises an evaluation microcomputer 81 having power supply terminal VDD and GND connected to a power supply 86 and ground 87, and input terminals 82, 83,- - -, and selectors 84, 85,- - - connected to the input terminals 82, 83,- - -.

In operation, the input terminal 82 is set to be high, when the selector 84 selects an X terminal, and it is connected to a hardware system to be evaluated, when it selects a Y terminal. On the other hand, the input terminal 83 is set to be low, when the selector 85 selects an X terminal, and it is connected to the hardware system, when it selects a Y terminal.

Next, a probe terminating apparatus for an in-circuit emulator of a first preferred embodiment according to the invention will be explained in FIGS. 5 according to the invention will be explained in FIGS. 5 and 6.

Figure 5:
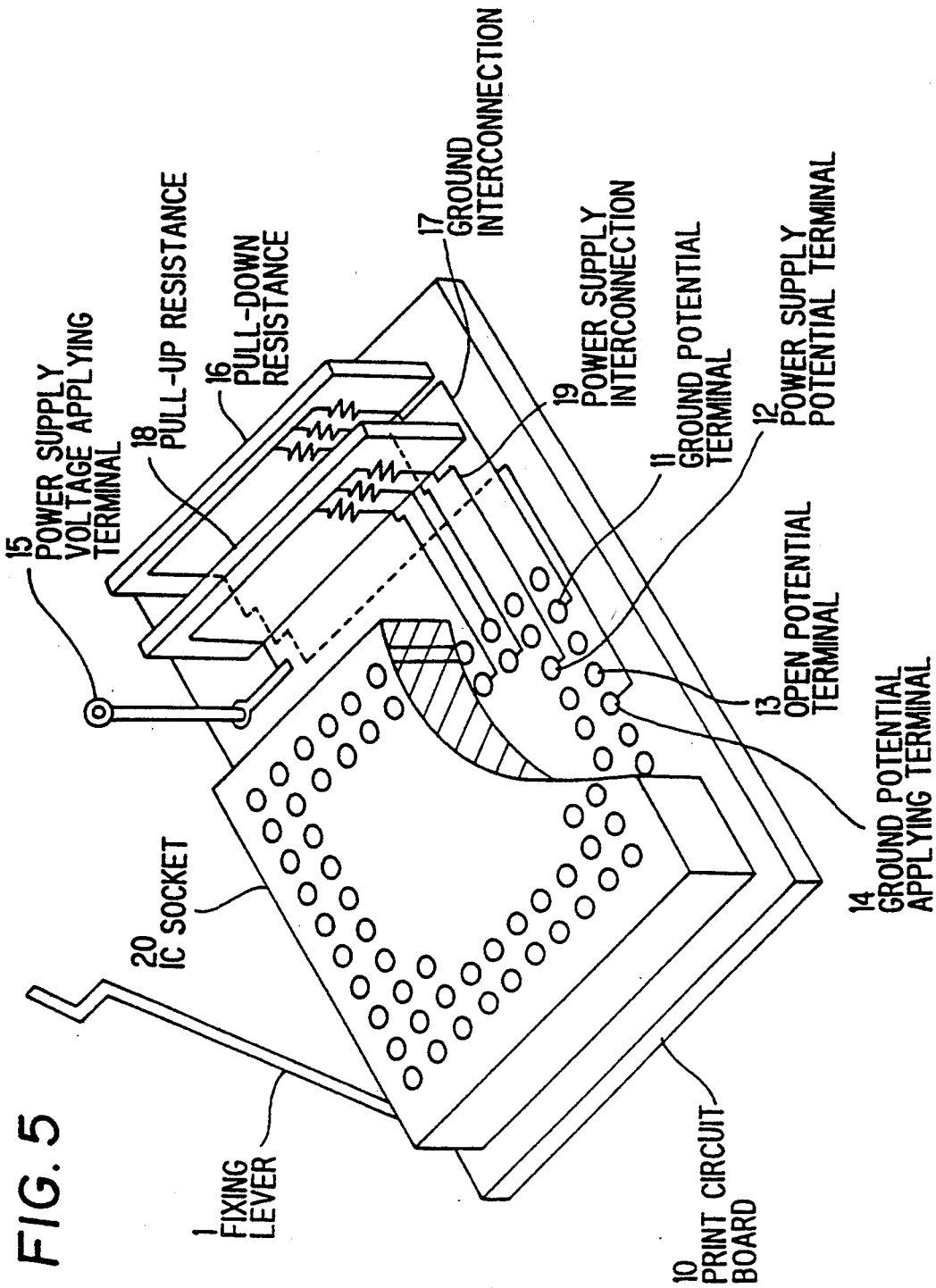
FIG. 5 is a perspective view showing a probe terminating apparatus for an in-circuit emulator in a first preferred embodiment according to the invention.
Figure 6:
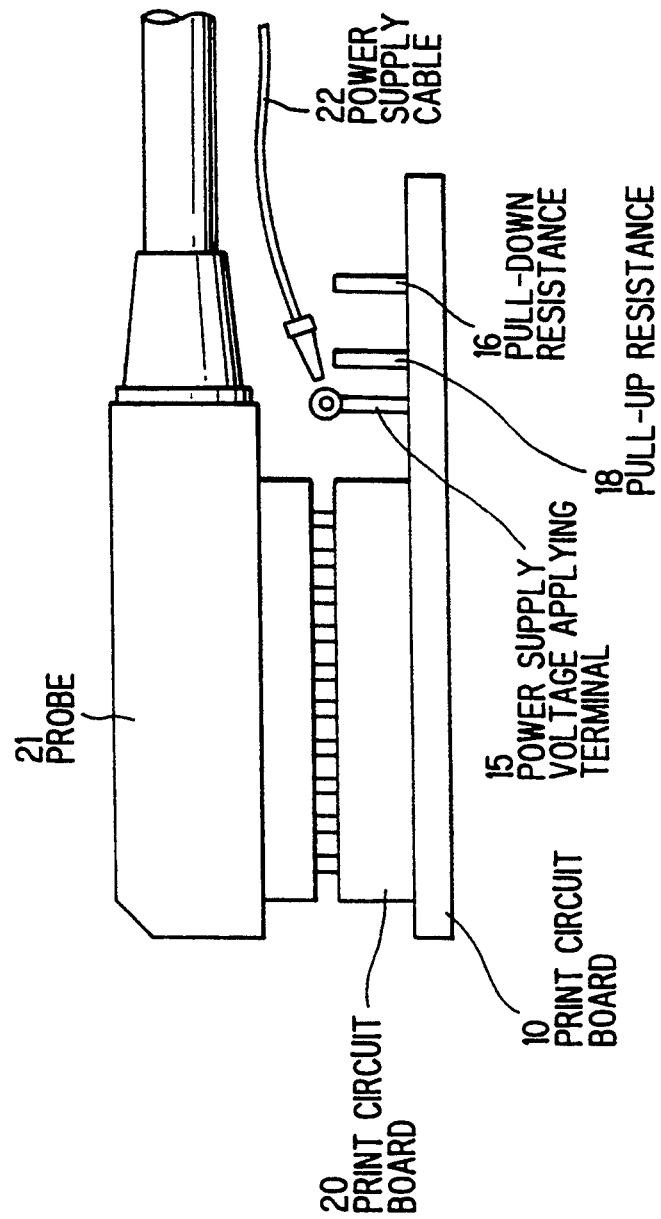
FIG. 6 is a front view showing a probe of an in-circuit emulator connected to the probe terminating apparatus in the first preferred embodiment.

In FIG. 5, the apparatus comprises an IC socket 20 provided on a print circuit board 10 into which plural connecting pins of a hardware system to be evaluated in operation are inserted, in ground potential terminals 11, power supply terminals 12 and open potential terminals 13 connected to the IC socket 20, a ground potential applying terminal 14 and a power supply voltage applying terminal 15 provided on the print circuit board 10, a pull-down resistance apparatus 16 connected between the ground potential terminal 11 and the ground potential applying terminal 14 by an interconnection 17, a pull-up resistance apparatus 18 connected between the power supply potential terminal 12 and the power supply voltage applying terminal 15 by an interconnection 19, and a fixing lever 1.

In this apparatus, the IC socket 20 is of a PGA (pin grid array) type by which the terminals 11 to 14 are connected to a probe (not shown) of the in-circuit emulator.

In operation, a probe 21 of the in-circuit emulator is connected to the IC socket 20, and a power supply cable 22 is connected to the power supply voltage applying terminal 15. As a result, the power supply potential terminal 12 is pulled up via the interconnection 19 by the pull-up resistance apparatus 18.

The ground potential applying terminal 14 is for a terminal corresponding to a ground terminal of a microcomputer, and is connected via the probe 21 to a ground potential in the in-circuit emulator. As a result, the ground potential terminal 11 is pulled down via the interconnection 17 by the pull-down resistance apparatus 16.

On the other hand, the open terminal 13 is a terminal which is not connected to any interconnection. Therefore, terminals which are not required to be pulled up and down are connected to the open terminals 13.

As described above, a probe of an in-circuit emulator is connected to the IC socket 20 of the probe terminating apparatus, so that an evaluation microcomputer in the in-circuit emulator is set at terminals to be specifically high, low and open.

Figure 7:
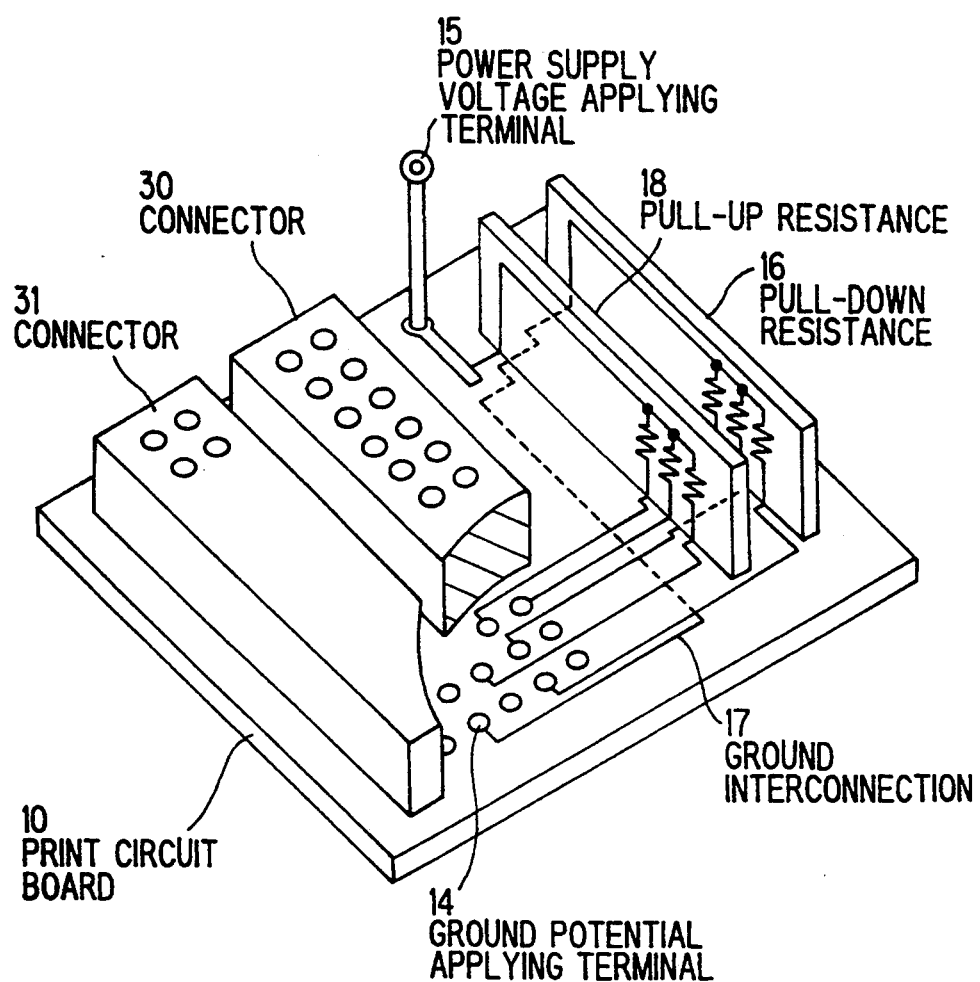
FIG. 7 is a perspective view showing a probe terminating apparatus for an in-circuit emulator in a second preferred embodiment according to the invention.
Figure 8:
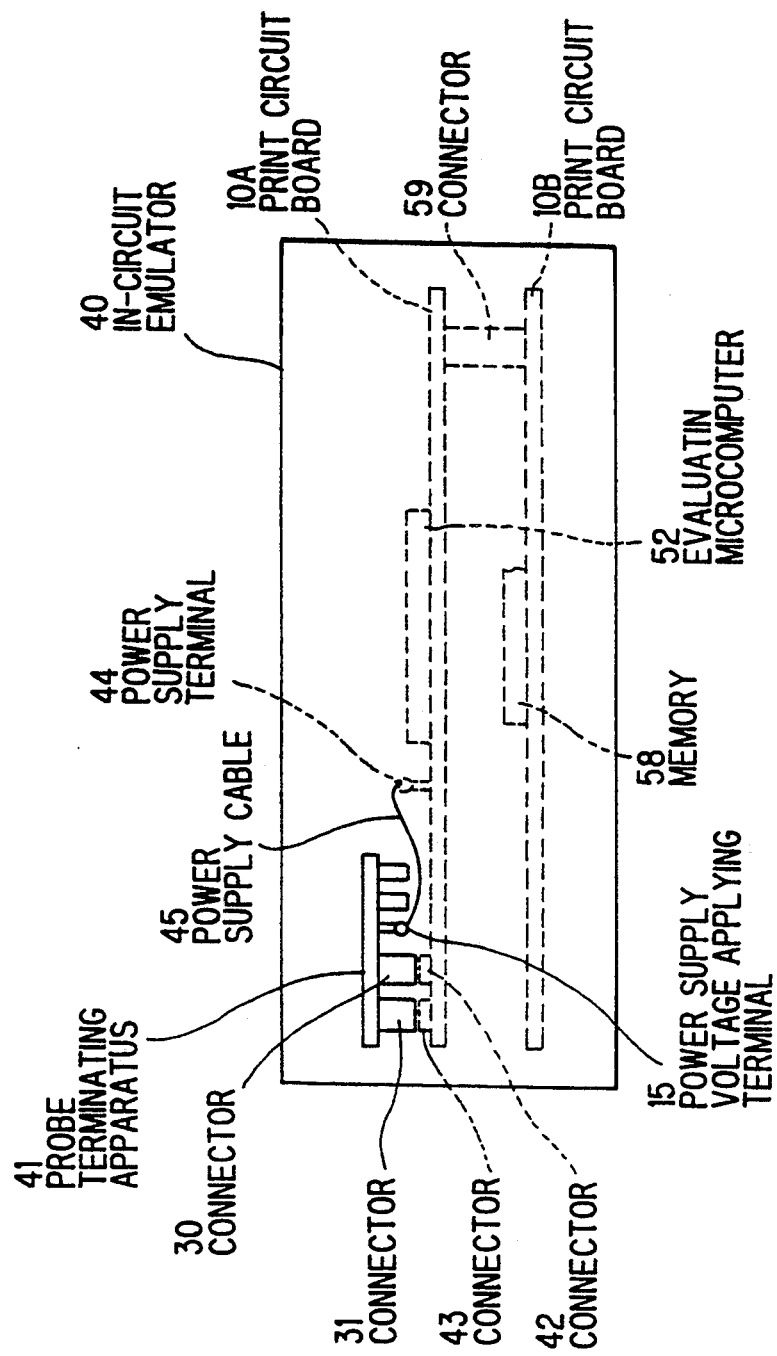
FIG. 8 is an explanatory view showing the probe terminating apparatus connected to the in-circuit emulator in the second preferred embodiment.

FIG. 7 shows a probe terminating apparatus for an in-circuit emulator of a second preferred embodiment according to the invention, and FIG. 8 shows the connection between the prove terminating apparatus and an in-circuit emulator, wherein like parts are indicated by like reference numerals between the first and second preferred embodiments.

The second preferred embodiment only in that the IC socket 20 is replaced by connectors 30 and 31.

The connectors 30 and 31 are connectors for connecting the in-circuit emulator 40 to the probe terminating apparatus 41.

The in-circuit emulator 40 comprises print circuit boards 10A and 10B connected by a connector 59, wherein an evaluation microcomputer 52, connectors 42 and 43, and a power supply terminal 44 are provided on the print circuit board 10A, and a memory 58 for storing a program to be developed is provided on the print circuit board 10B.

In operation, the connectors 30 and 31 of the probe terminating apparatus 41 are connected to the connectors 42 and 43 of the in-circuit emulator 40, and the power supply voltage applying terminal 15 of the probe terminating apparatus 41 is connected to the power supply terminal 44 of the in-circuit emulator 40 by a power supply cable 45. As a result, terminals of the evaluation microcomputer 52 are set to be specifically high, low and open.

As described above, a probe terminating apparatus according to the invention makes an in-circuit emulator small in size, simplified in construction and low in cost, because the in-circuit emulator is not required to have a space for the connection of a probe.

Further, a probe terminating apparatus according to the invention induces no through-current at input gates and provides no influence on the reliability of a device of an evaluation microcomputer, etc. because terminals thereof are not required to be pulled up and down, thereby resulting in the change of electric characteristics.

Still further, a probe terminating apparatus provides an in-circuit emulator, an evaluation microcomputer of which maintains to be equivalent to a microcomputer in a hardware to be evaluated in operation, because there is no necessity to include selectors and no consideration of signal propagation delay.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching herein set forth.

What is claimed is:

1. A probe terminating apparatus for an in-circuit emulator, said probe comprising:
    ground terminals, power supply terminals, and open terminals provided on a print circuit board;
    a terminal for applying ground potential and a terminal for applying power supply voltage provided on said print circuit board;
    a pull-down resistance apparatus connected between each of said ground terminals and said terminal for applying said ground potential;
    a pull-up resistance apparatus connected between each of said power supply terminals and said terminal for applying said power supply voltage; and
    means for connecting terminals which are pulled down and pulled up, and the terminals which are unnecessary pulled down and up in an evaluation microcomputer to corresponding ones of said ground terminals, said power supply terminals and said open terminals.

2. The probe terminating apparatus for an in-circuit emulator, according to claim 1, wherein:
    said connecting means is an IC socket, to which the probe connected to said terminals of said evaluation microcomputer is connected.

3. The probe terminating apparatus for an in-circuit emulator, according to claim 1, wherein:
    said connecting means is a connector, to which the connector connected to said terminals of said evaluation microcomputer is connected.

* * * * *